United States Patent
Mercado

(10) Patent No.: US 6,919,629 B2
(45) Date of Patent: Jul. 19, 2005

(54) METHOD AND SYSTEM FOR INTEGRATED CIRCUIT PACKAGING

(75) Inventor: Humberto Quezada Mercado, Aguascalientes (MX)

(73) Assignee: Texas Instruments Incorporated, Dallas, TX (US)

( * ) Notice: Subject to any disclaimer, the term of this patent is extended or adjusted under 35 U.S.C. 154(b) by 13 days.

(21) Appl. No.: 10/651,418

(22) Filed: Aug. 29, 2003

(65) Prior Publication Data

US 2005/0046004 A1 Mar. 3, 2005

(51) Int. Cl.$^7$ .......................... H01L 23/22; H01L 23/24

(52) U.S. Cl. ...................................... 257/687; 257/787

(58) Field of Search ................................ 257/687, 787, 257/788

(56) References Cited

U.S. PATENT DOCUMENTS

| | | | | |
|---|---|---|---|---|
| 6,114,189 A | * | 9/2000 | Chia et al. .................. | 438/112 |
| 6,791,198 B2 | * | 9/2004 | Street et al. ................ | 257/786 |
| 2004/0183175 A1 | * | 9/2004 | Terui et al. ................. | 257/678 |

* cited by examiner

*Primary Examiner*—Phat X. Cao
(74) *Attorney, Agent, or Firm*—Yingsheng Tung; Wade James Brady, III; Frederick J. Telecky, Jr.

(57) ABSTRACT

According to one embodiment of the invention, a mold tool for packaging integrated circuits includes a first mold press die including a first non-planar surface and a second mold press die including a second non-planar surface. The first and second non-planar surfaces form the upper and lower surfaces of a mold cavity when the first and second mold press die are engaged. The mold tool also includes a bright TiN coating disposed on the first non-planar surface. The bright TiN coating operates to decrease residue on the first non-planar surface from a mold compound. The mold compound is distributed into the mold cavity to form a package operable to encapsulate an integrated circuit.

10 Claims, 2 Drawing Sheets

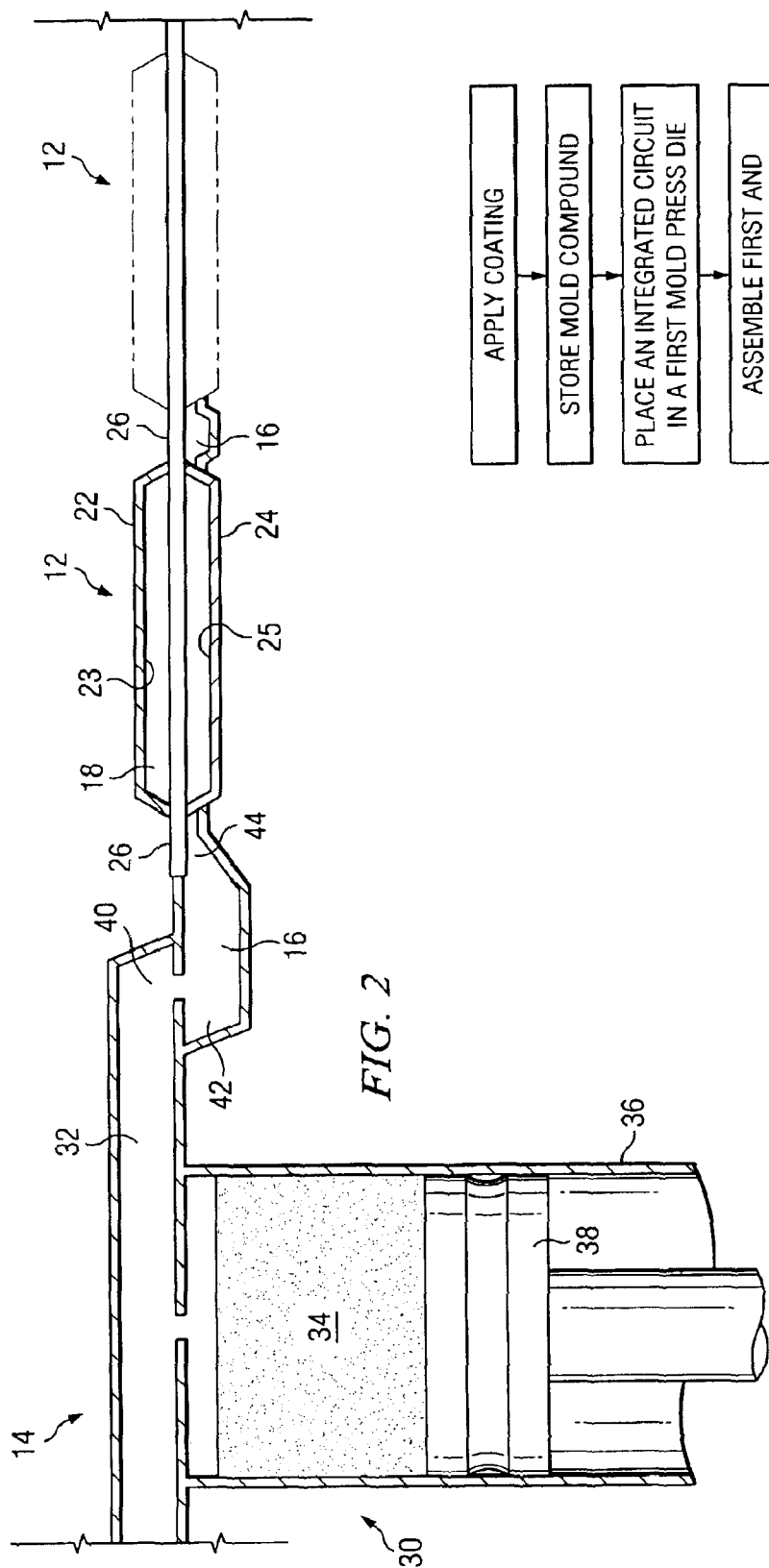

METHOD AND SYSTEM FOR INTEGRATED CIRCUIT PACKAGING

TECHNICAL FIELD OF THE INVENTION

This invention relates generally to the field of integrated circuit packaging and, more specifically, to an improved method and system for integrated circuit packaging.

BACKGROUND OF THE INVENTION

The packaging of integrated circuits may include encapsulating semiconductor chips and their associated components within a molding. A mold press compresses two mold press dies to encapsulate an integrated circuit within a cavity of the mold. A mold compound is transferred through a distribution system to the mold cavity to allow the mold compound to partially or completely surround the integrated circuit. Because the mold compound usually includes an abrasive, high temperature epoxy resin that leaves residue on the mold press dies, the mold press dies are periodically removed from the production line for the cleaning and restoration. Cleaning processes are performed on the mold press dies to prevent quality issues and to maintain the condition of the mold press dies.

SUMMARY OF THE INVENTION

According to one embodiment of the invention, a mold tool for packaging integrated circuits includes a first mold press die including a first non-planar surface and a second mold press die including a second non-planar surface. The first and second non-planar surfaces form the upper and lower surfaces of a mold cavity when the first and second mold press dies are engaged. The mold tool also includes a bright TiN coating disposed on the first non-planar surface. The bright TiN coating operates to decrease residue on the first non-planar surface from a mold compound. The mold compound is distributed into the mold cavity to form a package operable to encapsulate an integrated circuit.

Some embodiments of the invention provide numerous technical advantages. Other embodiments may realize some, none, or all of these advantages. For example, an advantage may be that one or more mold press dies are coated with a bright TiN coating. The bright TiN coating may have a substantially higher hardness coefficient than conventional TiN coatings. Another advantage may be that the bright TiN coating may reduce the buildup of mold compound residue on the surfaces of the coated mold press die. A further advantage may be that the bright TiN coating may increase the number of cycles in which the mold tool can be used before the mold press die must be cleaned. Thus, the frequency of costly and counter productive cleaning processes may be reduced, and the life span of the mold tool may be increased.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which:

FIG. 2 illustrates an example distribution system for the packaging of integrated circuits in accordance with an embodiment of the invention;

FIG. 3 illustrates an example mold chase for the packaging of integrated circuits in accordance with an embodiment of the invention; and FIG. 4 illustrates an example method for packaging integrated circuits in accordance with an embodiment of the invention.

DETAILED DESCRIPTION OF EXAMPLE EMBODIMENTS OF THE INVENTION

Figure 1:
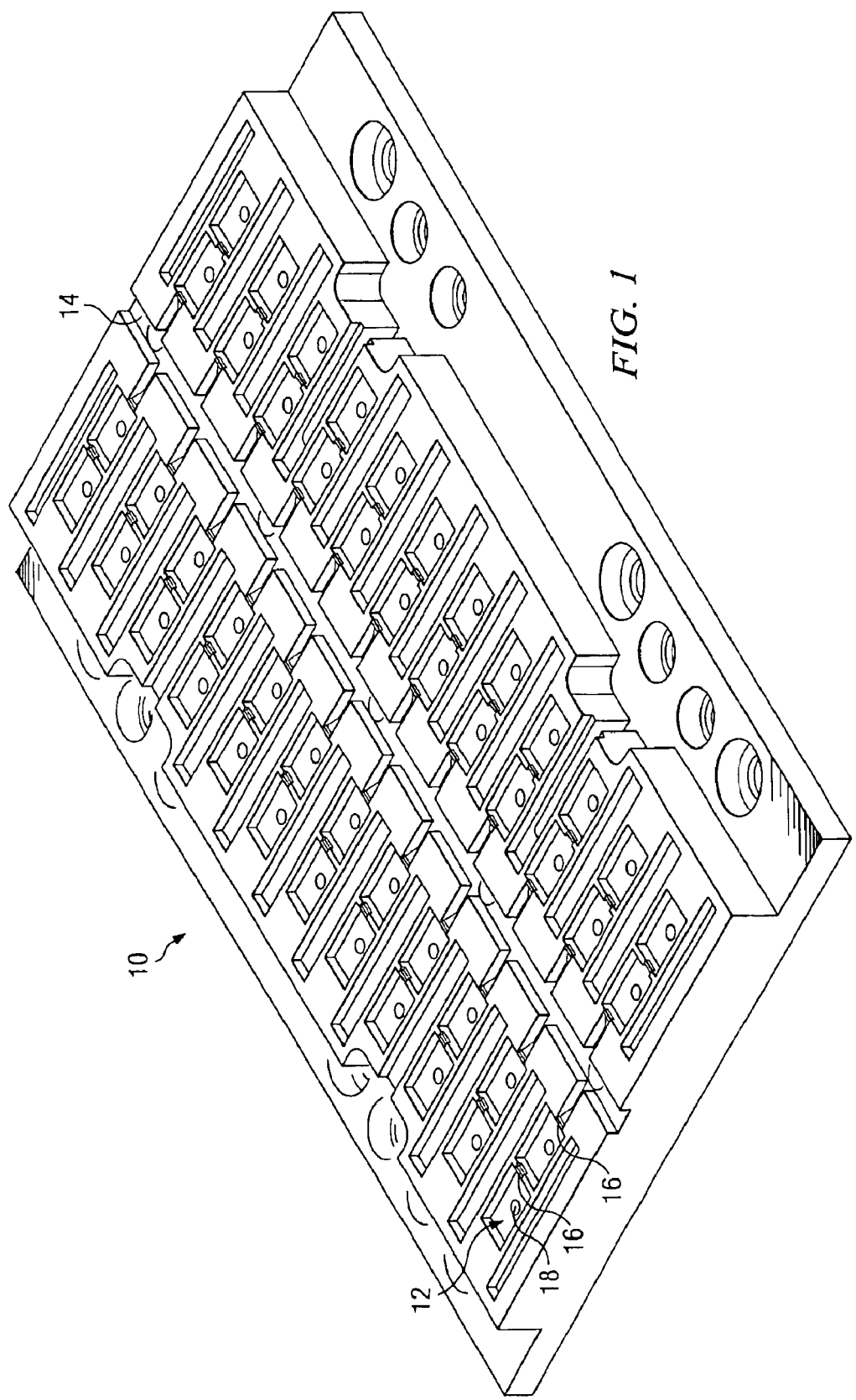
FIG. 1 illustrates an example mold tool for the packaging of integrated circuits in accordance with an embodiment of the invention.

Example embodiments of the present invention and their advantages are best understood by referring now to FIGS. 1 through 4 of the drawings, in which like numerals refer to like parts.

In order to package integrated circuit devices such as processors, memories, logic units, and the like that might comprise field effect transistors and other semiconductor structures, the integrated circuit devices are placed in a mold tool that operates to encapsulate each integrated circuit device in a set mold compound. The mold tool includes a mold chase and a distribution system coupled to the mold chase. The distribution system typically disperses a liquid mold compound through one or more passages before transferring the mold compound into the mold cavity. Because the mold compound typically leaves a residue on the mold press dies, the mold press dies are periodically removed from the production line for the cleaning and restoration. Cleaning processes, which are performed on the mold press dies to prevent quality issues and maintain mold die conditions, are costly and result in a productivity loss. According to various embodiments of the present invention, the surfaces of the mold press dies that are adjacent to the mold compound during the packaging process are coated with a bright TiN coating. The bright TiN coating reduces the buildup of mold compound residue on the surfaces of the mold press dies. Thus, the bright TiN coating increases the number of cycles in which a mold tool can be used before the mold press dies must be cleaned.

FIG. 1 illustrates a mold chase system 10 for the packaging of integrated circuits in accordance with an embodiment of the invention. The mold chase system 10 includes one or more mold chases 12, a distribution system 14, and one or more gate runners 16 coupling the distribution system 14 to the one or more mold chases 12. The mold chases 12, distribution system 14, and gate runners 16 of the mold chase system 10 operate cooperatively to disperse mold compound through the system 10 to encapsulate one or more integrated circuits disposed in the mold chase system 10 in a mold.

A mold chase 12 is formed when first and second mold press dies are assembled to form a mold cavity 18. The first and second mold press dies are illustrated in FIGS. 2 and 3 and will be described in greater detail below. The first and second mold press die may be clamped or otherwise aligned together such that each mold chase 12 is compressed to form a seal surrounding a corresponding mold cavity 18. Although the mold chase 12 and first and second mold press dies 22 and 24 may be of any appropriate material, in particular embodiments the mold press dies 22 and 24 are comprised of silicon nitride.

In operation, the first and second mold press dies 22 and 24 are assembled and clamped together to form a mold cavity 18. Each mold cavity 18 encapsulates an integrated circuit and its corresponding components. Mold compound is transferred from a mold compound source through the distribution system 14. The gate runner 16 of the distribution system 14 couples to a corresponding mold cavity 18. Mold compound is transferred into the mold cavity 18 through the gate runner 16 and is allowed to cure to form a package surrounding the integrated circuit. After curing, the mold press dies forming the mold chases 12 are disassembled from one another. The cured mold compound forms a package around the integrated circuit, which protects the packaged integrated circuit from moisture, dust, and pollutants during subsequent fabrication processes and use.

FIG. 2 illustrates an example distribution system 14 for the packaging of integrated circuits within a mold chase 12 in accordance with an embodiment of the invention. As described above, the mold chase 12 includes a first mold press die 22 and a second mold press die 24. The first mold press die 22 includes a first non-planar surface 23. The second mold press die 24 includes a second non-planar surface 25. The first and second mold press dies 22 and 24 are clamped together such that the mold chase 12 is compressed to form a seal surrounding a corresponding mold cavity 18. The first non-planar surface 23 and second non-planar surface 25 form upper and lower surfaces of a mold cavity 18 when first and second mold press dies 22 and 24 are engaged. The mold chase 12 may also include a lead frame 26. The lead frame 26 may be loaded between the first mold press die 22 and the second mold press die 24. When the first and second mold press dies 22 and 24 are assembled together, the mold cavity 18 is formed around a portion of the lead frame 26 and a semiconductor device. In particular embodiments, the lead frame 26 may operate to couple two or more mold chases 12. A second gate runner 28 may also couple the two mold chases 12. Accordingly, a single lead frame 26 may link the distribution system 14 to multiple mold chases 12, and each mold chase 12 may store a semiconductor device for encapsulation during the molding process. The mold chase 12 is coupled to the distribution system 14 to receive mold compound 34. The high temperature mold compound 34 is transferred under high pressure through the distribution system 14. In particular embodiments, the surface of the mold chase 12 is on the order of 170° to 175° Celsius. The mold compound 34, which will be described in further detail below, flows under the application of heat and pressure. As the mold compound 34 passes through the gate runner 16, the velocity of the mold compound 34 increases and the mold compound 34 is forced inside the first cavity. Where the lead frame 26 couples two or more chases 12 separated by gate runners 16, the mold compound 34 is also forced inside the second gate runner 16 and an additional mold chase 12.

The distribution system 14 includes a mold compound source system 30, one or more passages 32, and a gate runner 16. The passages 32, mold compound source system 30, and gate runner 16 operate cooperatively to transfer mold compound 34 through the distribution system 14 for the encapsulation of integrated circuits in the one or more mold chases 12. The mold compound source system 30 includes a mold compound source 36 for storing mold compound 34 before the mold compound 34 is distributed to the mold cavity 18. The mold compound 34 may be any suitable type of plastic or polymer, such as thermosets or thermoplastics. The mold compound 34 may include a thermoset comprised of an epoxy resin and fillers and may be heated to a temperature on the order of 170° to 175° C. while in the distribution system 14. Mold compound fillers may include alumina, magnesium oxide, silicon nitride, or a combination thereof. Mold compound fillers lower the coefficient of thermal expansion and improve the thermal conductivity and mechanical properties of the mold compound 34. Prior to the distribution of the mold compound 34, the mold compound 34 is typically in the form of powder, granules, or cold compacted powder pellets or preforms, or a low viscosity liquid.

The mold compound source 36 may be formed in any shape or size suitable for molding applications. Mold compound source system 30 also includes a plunger 38 or other compression tool. The size and shape of the plunger 38 typically corresponds to the size and shape of the mold compound source 36. Accordingly, where mold compound source 36 is substantially cylindrical, the plunger 38 may also be substantially cylindrical and may be shaped to fit snugly inside mold compound source 36. The plunger 38 may be used in conjunction with the mold compound source 36 to apply a compressive load to the mold compound 34 in the mold compound source 36. The compressive load may operate to transfer the mold compound 34 from the mold compound source 36 and through the distribution system 14.

The distribution system 14 also includes one or more passages 32 coupled to the mold compound source system 30. The passages 32 may include cylindrically shaped tubes or pipes or any other conduit suitable for transporting mold compound 34 from mold compound source system 30. The one or more passages 32 are adapted to couple the mold compound source system 30 with the gate runner 16. Accordingly, a distal end 40 of one of the passages 32 is coupled to a first end 42 of the gate runner 16. A second end 44 of the gate runner 16 forms a transition from the distribution system 14 to the mold chase 12. The flow of the mold compound 34 through the gate runner 16 has an influence on the temperature and viscosity of the mold compound 34 as it contacts the lead frame 26 and the integrated circuit. Although the gate runner 16 may be of any shape or size suitable for transitioning the distribution system 14 to mold chase 12, the size and shape of the gate runner 16 may be machined such that the gate runner 16 controls the pressure drop inside the mold cavity 18. Because the mold compound 34 is heated significantly as the mold compound 34 flows from the gate runner 16 to the mold cavity 18, the temperature rise also influences the viscosity of the mold compound 34. In turn, the viscosity of the mold compound 34 influences quality parameters of the molding process such as short fills, wire sweep, and gate remains.

The gate runner 16 may be comprised of steel and/or carbide or any other material suitable for molding processes. Although the gate runner 16 may have substantially planar surfaces, the gate runner 16 may be of any shape or size suitable for transitioning the distribution system 14 to the mold chase 12. Thus, the gate runner 16 may be substantially box-shaped, conical or any other shape that operates to funnel the mold compound 34. As described above, gate runner 16 includes a first end 42 and a second end 44 and operates to transfer mold compound 34 from distribution system 14 to mold cavity 18. In particular embodiments, the cross-sectional area of the second end 44 of the gate runner 16 may be less than the cross-sectional area of the first end 42 of the gate runner 16. For example, where the first end 42 of the gate runner 16 has a cross-sectional area on the order of 0.0022 square inches, the second end 44 of the gate runner 16 may have a cross-sectional area on the order of 0.0006 square inches. Because the cross-sectional area of the second end 44 may be smaller than the cross-sectional area of the first end 42, the second end 44 may operate to funnel the mold compound 34 from the gate runner 16 into the mold cavity 18 of the mold chase 12.

FIG. 3 illustrates an example mold chase 12 for the packaging of integrated circuits in accordance with an embodiment of the invention. As described above, the mold chase is formed when the first mold press die 22 is aligned adjacent to the second mold press die 24 to form the mold cavity 18. The first and second mold press dies 22 and 24 may be clamped or otherwise assembled together such that the first and second mold press dies 22 and 24 are aligned to form a seal surrounding a corresponding mold cavity 18. The mold chase 12 and first and second mold press dies 22 and 24 may be of any appropriate material. In particular embodiments, the mold press dies 22 and 24 are comprised of silicon nitride. Because the mold compound 34 usually includes an abrasive, high temperature epoxy resin that leaves residue on the mold press dies 22 and 24, the mold press dies 22 and 24 are periodically removed from the production line for the cleaning and restoration. For example, a mold press die fabricated using conventional materials may be removed from production after 600K cycles or approximately every twenty-four hours. Cleaning processes are then performed on the mold press die to prevent quality issues and maintain the condition of the mold press die.

According to various embodiments of the present invention, the surfaces of the mold press dies 22 and 24, which are adjacent to the mold compound during the packaging process, may be coated with a bright TiN coating 50. In particular embodiments, the first non-planar surface 23 of the first mold press die 22 and the second non-planar surface 25 of the second mold press die 24 may be coated with the bright TiN coating 50. Alternatively, either the first non-planar surface 23 of the first mold press die 22 or the second non-planar surface 25 of the second mold press die 24 may be coated with the bright TiN coating 50. Thus, the bright TiN coating 50 may be disposed on either the first mold press die 22, the second mold press die 24, or both.

The bright TiN coating 50 may comprise a high strength metal composite with a substantially higher hardness coefficient than conventional TiN coatings. A higher hardness coefficient may increase the number of cycles in which the mold tool may be used before cleaning is required. Another characteristic of the bright TiN coating 50 may be the bright or shiny appearance of the TiN coating 50 in contrast with the matte appearance of conventional coatings. The bright characteristics of the bright TiN coating 50 may also aid in the packaging process by minimizing mold cleaning, eliminating the adherence of plastic on the mold press dies 22 and 24, and increasing the life of the mold tool.

In particular embodiments, the bright TiN coating 50 may comprise Titanium and Nitrogen combined with Rhodium or another suitable metal. For example, the bright TiN coating 50 may comprise at least five percent Rhodium. A bright TiN coating 50 that includes at least five percent Rhodium and is on the order of 1.75–2.25 microns in thickness may have a hardness coefficient on the order of 2300 HV as compared to a hardness coefficient of 900 HV associated with conventional TiN coating materials. Accordingly, where the bright TiN coating 50 includes at least five percent Rhodium, the bright TiN coating 50 may operate to increase the life span of the mold tool to approximately 30,000 k mold cycles before cleaning of the first and second mold press dies 22 and 24 may be required. Thus, in particular embodiments, the mold press dies 22 and 24 may be used for packaging production for approximately five days before undergoing cleaning.

In various embodiments, the bright TiN coating 50 may be disposed on the first and second non-planar surfaces 23 and 25 of the first and second mold press dies 22 and 24 using a sputtering process performed in a coating chamber. In particular embodiments, the coating chamber may include a heated vacuum chamber. The bright TiN coating 50 may be applied to the first and second non-planar surfaces 23 and 25 using a sputtering process in a gas environment. The gas environment may include a noble gas, such as Hydrogen, Argon, Neon, Helium, or a combination thereof, introduced into the chamber as the bright TiN coating 50 is applied to the first and second mold press dies 22 and 24. For example, the first and second mold press dies 22 and 24 may be rotated in the coating chamber as Titanium, Nitrogen, and Rhodium are introduced into the coating chamber and sputtered on the first and second non-planar surfaces 23 and 25 in an Argon environment. The use of a hot filament cathode and a reactive gas may also aid in the application process by increasing the dispersement of the bright TiN coating 50 on the first and second non-planar surfaces 23 and 25. Although the bright TiN coating 50 is described as being applied using a sputtering process, the present invention contemplates that the bright TiN coating 50 may be applied to the first and second non-planar surfaces 23 and 25 using any suitable processes for applying such a coating to a substrate surface.

In operation, an integrated circuit and its corresponding components are encapsulated in the mold cavity 18, which is formed when the first and second mold press dies 22 and 24 are assembled adjacent to one another. Mold compound 34 is transferred from a mold compound source system 30 through the distribution system 14 and into the mold cavity 18. When allowed to cure, the mold compound 34 forms a package surrounding the integrated circuit, which protects the packaged integrated circuit from moisture, dust, and pollutants during subsequent fabrication processes. After curing, the mold press dies 22 and 24 forming the mold chases 12 are disassembled from one another. The bright TiN coating 50 on the first and second non-planar surfaces 23 and 25 of the first and second mold press dies 22 and 24 may reduce the adherence of mold compound residue on the first and second mold press dies 22 and 24. Thus, the bright TiN coating 50 may increase the number of cycles in which a mold tool can be used before the mold press dies 22 and 24 are removed from production to be cleaned.

FIG. 4 illustrates an exemplary method for packaging integrated circuits in accordance with an embodiment of the invention. In step 78, a bright TiN coating 50 is applied to the first and second mold press dies 22 and 24. As described above, the bright TiN coating 50 may be sputtered or otherwise applied to the first and second non-planar surfaces 23 and 25 of the first and second mold press dies 22 and 24. The bright TiN coating 50 may have a thickness on the order of 1.75–2.25 microns and may comprise Titanium and Nitrogen combined with Rhodium or another high strength metal resulting in a substantially higher hardness coefficient than conventional TiN coatings. In particular embodiments, the bright TiN coating 50 may include at least five percent Rhodium. The bright TiN coating 50 may operate to increase the life span of the mold tool to approximately 30,000 k mold cycles before cleaning of the first and second mold press dies 22 and 24 may be required In step 80, the mold compound 34 is stored in the mold chase system 10. In particular embodiments, the mold compound 34 may be stored in the mold compound source 36 of the distribution system 14. An integrated circuit may then be placed in a first mold press die 22 of the mold chase 12 in step 82. The integrated circuit may be placed in the first mold press die 22 robotically or by any other method used in molding processes.

In step 84, the first mold press die 22 and the second mold press die 24 of the mold chase 12 are assembled. The mold press dies 22 and 24 may be assembled by engaging a first non-planar surface 23 of the first mold press die 22 with a second non-planar surface 25 of the second mold press die 24. For example, the first and second mold press dies 22 and 24 may be clamped together. The assembly of first and second mold press dies 22 and 24 encapsulates the integrated circuit in the mold cavity 18 and forms a seal around the integrated circuit.

In step 86, the mold compound 34 is distributed through the mold chase system 10. Distributing the mold compound 34 may include transferring the mold compound 34 through the distribution system 14 coupled to the mold cavity 18. As discussed above, the distribution system 14 may include one or more gate runners 16, one or more passages 32, and a mold compound source system 30. Accordingly, distributing the mold compound 34 may include transferring the mold compound from the mold compound source system 30, through the one or more passages 32, and into the gate runner 16, which then funnels the mold compound 34 into the mold cavity 18. For example, where the mold compound source system 30 includes mold compound source 36 and plunger 38, distributing the mold compound 34 may further include applying a compressive load to the mold compound 34 in mold compound source 36 using the plunger 38. The compressive load may force the mold compound 34 from the mold compound source 36 and into the one or more passages 32 where the mold compound 34 travels to the gate runner 16. The mold compound 34 is transferred through the gate runner 16 before it is distributed into the mold cavity 18.

Although embodiments of the invention and their advantages are described in detail, a person skilled in the art could make various alterations, additions, and omissions without departing from the spirit and scope of the present invention, as defined by the appended claims.

What is claimed is:

1. A mold tool for packaging integrated circuits, comprising:
    a first mold press die comprising a first non-planar surface;
    a second mold press die comprising a second non-planar surface, the first and second non-planar surfaces forming upper and lower surfaces of a mold cavity when the first and second mold press die are engaged; and
    a bright TiN coating disposed on the first non-planar surface, the bright TiN coating operable to decrease residue on the first non-planar surface from a mold compound, the mold compound distributed into the mold cavity to form a package, the package operable to encapsulate an integrated circuit.

2. The mold tool of claim 1, wherein the bright TiN coating is disposed on the second non-planar surface, the bright TiN coating operable to decrease residue on the second non-planar surface from the mold compound.

3. The mold tool of claim 1, wherein the bright TiN coating is between 1.75 and 2.25 microns in thickness.

4. The mold tool of claim 1, wherein the bright TiN coating is adapted to increase the life span of the mold tool to approximately 30,000 k mold cycles.

5. The mold tool of claim 1, wherein the bright TiN coating comprises TiN and Rhodium.

6. The mold tool of claim 1, wherein the bright TiN coating comprises at least five percent Rhodium.

7. The mold tool of claim 1, wherein the bright TiN coating is disposed on the first non-planar surface using a sputtering process.

8. The mold tool of claim 1, wherein the bright TiN coating is disposed on the first non-planar surface using a sputtering process in a gas environment.

9. The mold tool of claim 8, wherein the gas environment comprises Argon.

10. The mold tool of claim 1, wherein the mold compound comprises an epoxy resin of a temperature on the order of 170 to 175° C.

* * * * *